(12) United States Patent
Khannur

(10) Patent No.: US 7,286,024 B2
(45) Date of Patent: Oct. 23, 2007

(54) VOLTAGE-CONTROLLED OSCILLATOR WITH DIFFERENTIAL OUTPUT

(75) Inventor: Pradeep Basappa Khannur, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/922,038

(22) Filed: Aug. 19, 2004

(65) Prior Publication Data
US 2006/0038628 A1   Feb. 23, 2006

(51) Int. Cl.
*H03B 5/08* (2006.01)
*H03B 27/00* (2006.01)

(52) U.S. Cl. .................. 331/167; 331/45; 331/74; 331/117 R; 333/25

(58) Field of Classification Search .......... 331/45, 331/74, 167, 117 R; 333/25
See application file for complete search history.

(56) References Cited

U.S. PATENT DOCUMENTS

| | | | | |
|---|---|---|---|---|
| 3,711,773 A | * | 1/1973 | Hekimian et al. | 324/76.77 |
| 4,593,256 A | * | 6/1986 | Bickley | 331/117 R |
| 4,956,582 A | * | 9/1990 | Bourassa | 315/111.21 |
| 6,008,702 A | * | 12/1999 | Yamamoto | 331/179 |
| 6,259,325 B1 | * | 7/2001 | Ishizuka et al. | 330/301 |
| 6,501,341 B2 | | 12/2002 | Mashimo | 331/96 |
| 6,683,507 B2 | * | 1/2004 | Jeong | 331/117 R |
| 6,961,546 B1 | * | 11/2005 | Rofougaran et al. | 455/118 |
| 2004/0164817 A1 | * | 8/2004 | Nosaka | 333/25 |

FOREIGN PATENT DOCUMENTS

JP   09232192   8/1997

OTHER PUBLICATIONS

"*A Fully-Integrated CMOS RFIC for Bluetooth Applications*" by Aruna Ajjikuttira, et al., 2001 IEEE International Solid-state Circuits Conference, pp. 198-199, p. 446.

* cited by examiner

*Primary Examiner*—Robert Pascal
*Assistant Examiner*—James Goodley
(74) *Attorney, Agent, or Firm*—Conley Rose, P.C.

(57) ABSTRACT

A voltage-controlled oscillator for generating differential output is disclosed. The voltage-controlled oscillator comprises a Colpitts oscillator having a first inductor and a capacitive divider having at least two capacitors connected in series. A varactor is connected in series with the capacitive divider and to a reference voltage, and a second inductor is mutually coupled to the first inductor for providing the differential output. A second inductor is substantially centrally tapped and connected to the reference voltage for providing a substantially balanced output. The operating frequency of the voltage-controlled oscillator is dependent on an applicable potential difference across the varactor.

13 Claims, 4 Drawing Sheets

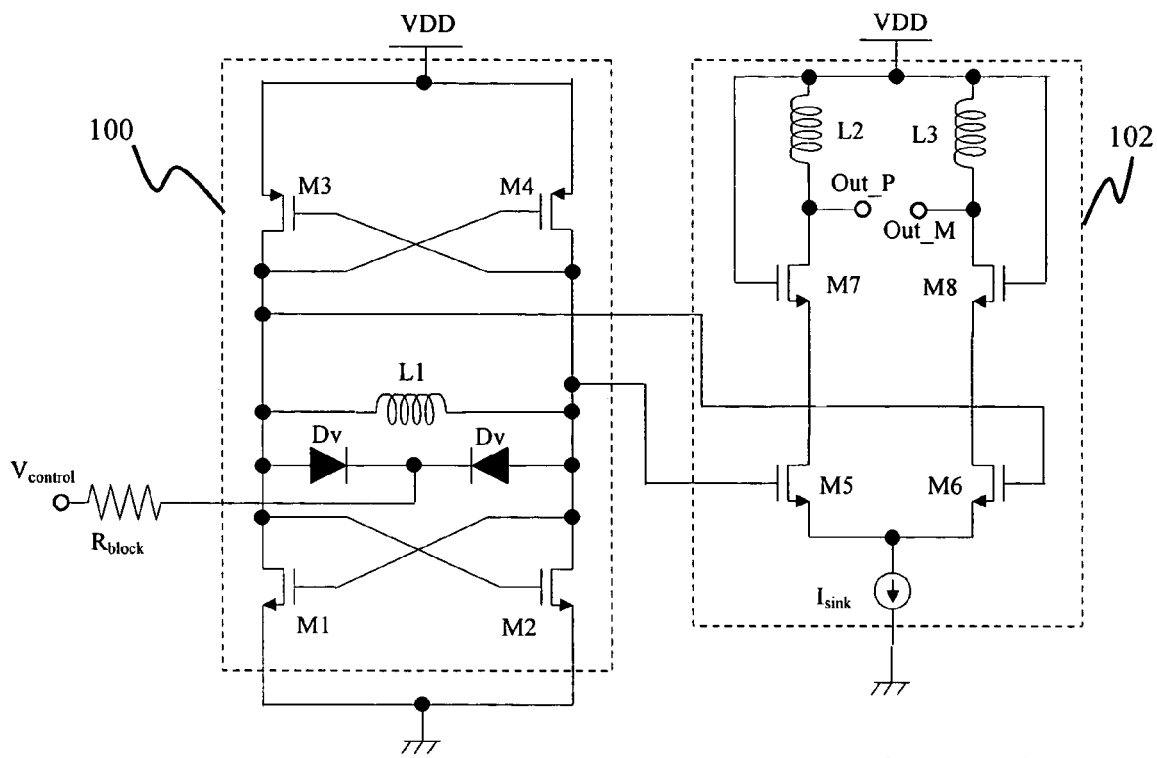
Fig. 1 – Prior Art
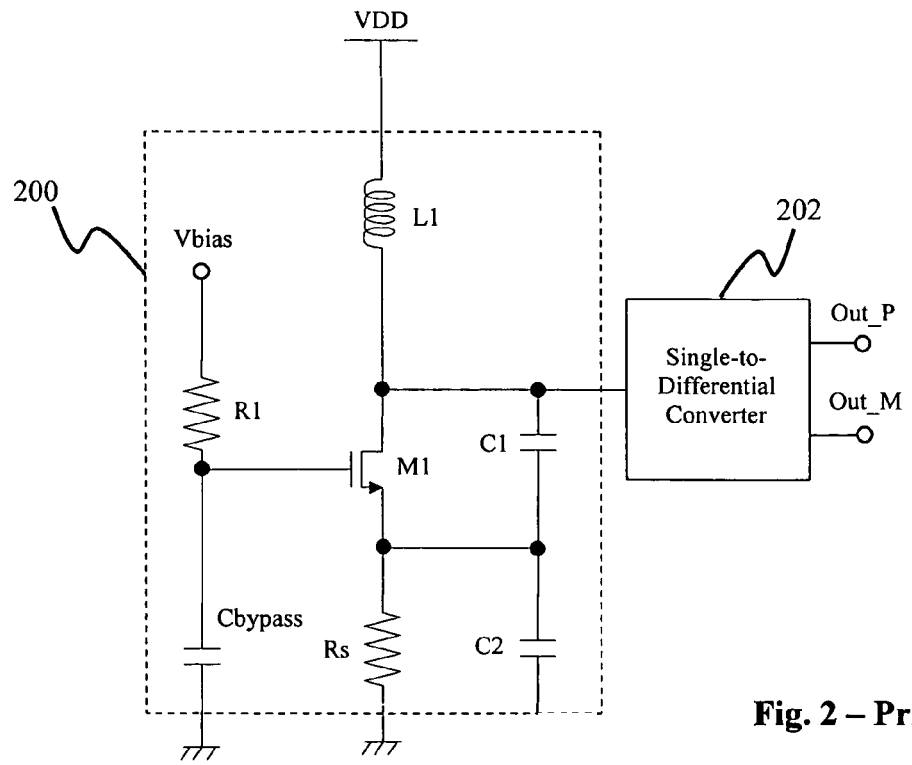
Fig. 2 – Prior Art

VOLTAGE-CONTROLLED OSCILLATOR WITH DIFFERENTIAL OUTPUT

FIELD OF INVENTION

The invention relates generally to oscillators. In particular, it relates to a voltage-controlled oscillator for high frequency operation and generating differential output.

BACKGROUND

Oscillators are commonly used in a variety of communication systems, such as radio frequency (RF) systems and other wireless communication systems. Within the variety of communication systems, oscillators are typically used in transmitter and receiver circuits of the communication systems. A common type of oscillator is the voltage-controlled oscillator (VCO).

One typical component of the VCO is a bipolar transistor (BJT). Another suitable component for the VCO is a complimentary metal oxide semiconductor (CMOS) transistor, which has lower power consumption than the BJT. However, a VCO implemented with CMOS transistors is inherently limited to operable frequencies of no more than 10 gigahertz (GHz). This is because as the frequency of the VCO implemented with CMOS increases to around 10 GHz, important operating characteristics of the VCO, for example phase-noise and differential output deteriorate increasingly. The deterioration of the differential output has an adverse effect on the quality of frequency generation by the VCO. The generated frequency is directly provided to a mixer's local oscillator input or a power amplifier input, essentially causes undesirable effects during transmission and reception of radiated signals. Therefore, the differential output of a VCO is an important consideration when designing the VCO.

An example of a commonly used VCO is the cross-coupled inductor capacitor (LC) voltage-controlled oscillator 100 implemented with a differential buffer 102 as shown in FIG. 1. The cross-coupled LC voltage-controlled oscillator 100 is typically coupled to the differential buffer 102 for differentiating the single-ended outputs of the cross-coupled LC voltage-controlled oscillator 100. The differential output generated by the differential buffer 102 is usually directly fed to the mixer's local oscillator. The oscillating frequency of the cross-coupled LC voltage-controlled oscillator 100 is dependent on the capacitance of both varactors Dv, the inductance of inductor L1 and accompanying parasitic capacitance and inductance associated with the varactor Dv and inductor L1 respectively. The differential buffer 102 has two inductors L2 and L3 for providing the differential output through output terminals Out_P, Out_M typically required by the mixer's input. A larger physical area of the differential buffer 102 and higher current are required when the cross-coupled LC voltage-controlled oscillator 100 is used for operating at higher oscillating frequency. This inevitably causes an increase in chip area and requires more current to operate at higher operating frequency. Implementation cost would be higher due to the number and physical size of circuit components used.

FIG. 2 shows a schematic diagram of a Colpitts oscillator 200 implemented with a single-ended-to-differential converter 202. The Colpitts oscillator 200 is commonly known to generate single-end output. The oscillating frequency of the Colpitts oscillator 200 is dependent on inductor L1, capacitors C1 and C2 and associated parasitic inductance and capacitance. Ideally and more specifically, the frequency of oscillation $f_o$ of the Colpitts oscillator 200 is dependent on the inductance L1 of inductor L1, the capacitances C1, C2 of capacitors C1 and C2 respectively and is represent by the following relationship:

$$fo = \frac{1}{2\pi\sqrt{L1\left(\frac{C1C2}{C1+C2}\right)}}$$

The frequency of oscillation $f_o$ is therefore controllable by varying capacitances C1, C2. The values of capacitances C1, C2 may be voltage-controlled when both capacitances C1, C2 are adjustable by the voltages across each capacitor C1 and C2. Hence, the Colpitts oscillator 200 may be used as a VCO by making capacitors C1 and C2 capacitance adjustable.

During actual operation of the Colpitts oscillator 200, the associated parasitic inductance and capacitance of the Colpitts oscillator 200 become more prominent as the frequency of oscillation $f_o$ increases. This renders the Colpitts oscillator 200 unusable to operate at high frequency, such as an operating frequency of 10 GHz.

The single-ended-to-differential converter 202 that is coupled to the Colpitts oscillator 200 performs a similar function as the differential buffer 102 of the cross-coupled LC voltage-controlled oscillator 100 of FIG. 1. The single-ended-to-differential converter 202 can be active or passive and converts the single-end outputs of the Colpitts oscillator 200 to differential output. A passive single-ended-to-differential converter has high power loss and is therefore not suitable for use in systems that have low thermal heat tolerance. An active single-ended-to-differential converter usually needs higher power for operation as operating frequency increases and is therefore not desired for use in systems that require low power consumption.

There is therefore a need for a voltage-controlled oscillator with low current consumption and which is capable of performing high frequency operation and provides differential output.

SUMMARY

Embodiments of the invention disclosed herein possess improved performance on current consumption and a capability of performing high frequency operation. Additionally, embodiments of the invention have smaller physical size and capable of providing differential output.

In accordance with one aspect of the invention, there is disclosed a voltage-controlled oscillator for generating differential output, the voltage-controlled oscillator comprises a Colpitts oscillator having a first inductor and a capacitive divider having at least two capacitors connected in series. A varactor having a cathode that is directly connected in series with the capacitive divider of the Colpitts oscillator and an anode that is connected to a reference voltage, and a second inductor is mutually coupled to the first inductor of the Colpitts oscillator for providing the differential output, and the second inductor being substantially centrally tapped and directly connected to a reference voltage for providing a substantially balanced output, wherein the operating frequency of the voltage-controlled oscillator is dependent on an applicable potential difference between a control terminal connected to the varactor and the reference voltage.

BRIEF DESCRIPTION OF THE DRAWINGS

Embodiments of the invention are disclosed hereinafter with reference to the drawings, in which:

FIG. 1 is a schematic diagram of a prior art, a cross-coupled LC voltage-controlled oscillator implemented with a differential buffer;

FIG. 2 is a schematic diagram of another prior art, a Colpitts oscillator implemented with a single-to-differential converter;

DETAILED DESCRIPTION

Embodiments of the invention are described hereinafter for addressing the need for a voltage-controlled oscillator with low current consumption and capable of performing high frequency operation and generating differential output.

For the purpose of brevity and clarity, the description of the invention is limited hereinafter to high frequency mixer applications. This however does not preclude embodiments to the invention from other applications that require similar operating performance as the high frequency mixer applications. The functional principles of generating differential output fundamental to the embodiments of the invention remain the same throughout the various embodiments.

Embodiments of the invention are described in greater detail hereinafter for a voltage-controlled oscillator.

A voltage-controlled oscillator (VCO) 300 according to an embodiment of the invention is described hereinafter with reference to FIGS. 3 to 5. The VCO 100 is preferably used in conjunction with a mixer in a wireless communication system, as known to those skilled in the art for generating and receiving radiated signals to and from other communication systems. Such a wireless communication system is suitably used for operating at a high frequency domain of approximately 10 GHz.

The circuit topology of the VCO 300 is described hereinafter with reference to FIG. 3, which is a circuit diagram depicting circuit elements of the VCO 300. The VCO 300 is optimized for providing a miniaturized circuit for fabrication on a semiconductor substrate and capable of generating differential output for driving, for example a 50 Ohm ($\Omega$) load. The generation of differential output by the VCO 300 is achieved without the use of any external single-ended-to-differential converters or differential buffers, as known to those skilled in the art. To this end, the VCO 300 includes a built-in converter feature to allow direct generation of differential outputs. This enables the VCO 300 to have a smaller structural size than a conventional VCO.

The VCO 300 is operable on less than 8 milliampere (mA), which is significantly less than the conventional VCO. Having a small structural size advantageously allows the VCO 300 to be used in an integrated circuit (IC) with less device space.

Figure 3:
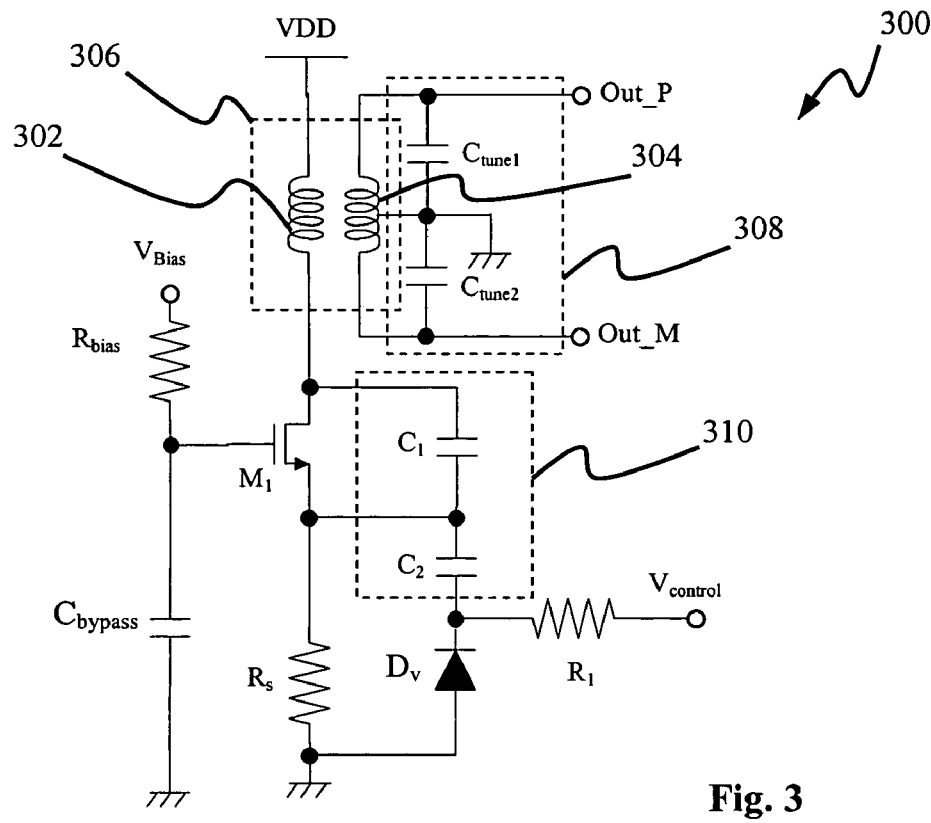
FIG. 3 is a schematic diagram of a voltage-controlled oscillator according to a preferred embodiment of the invention.
Figure 4:
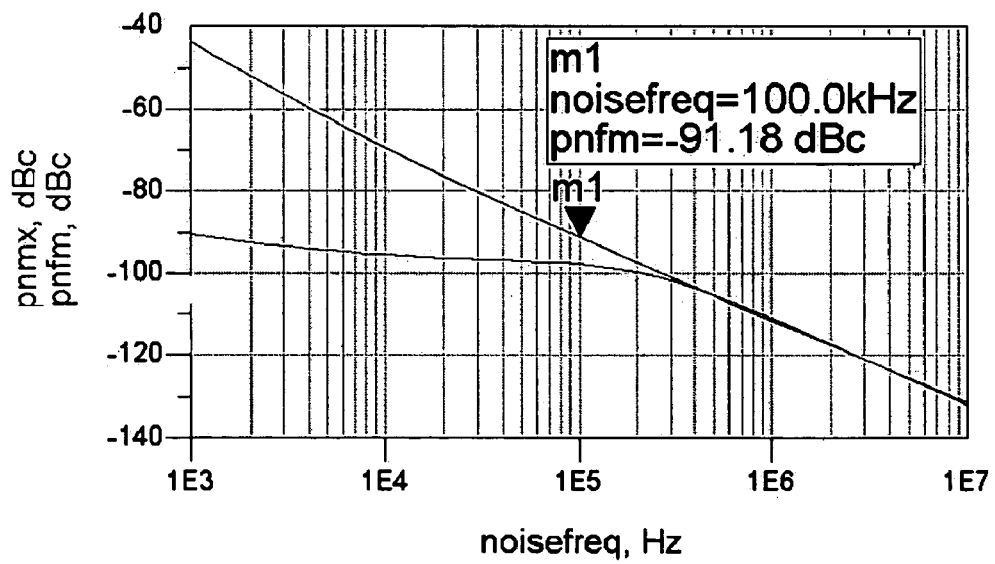
FIG. 4 is a phase noise plot of the voltage-controlled oscillator of FIG. 3 plotted at an operating frequency of 10 GHz.

The VCO 300 of FIG. 3 comprises a Colpitts oscillator 200 of FIG. 2, which has a first inductor 302 having a terminal connected to a supply voltage VDD. The other terminal of the first inductor 302 is connected to the drain of transistor $M_1$. The gate of transistor $M_1$ is connected to a voltage biasing terminal $V_{Bias}$ via a biasing resistor $R_{bias}$ in series therewith for biasing transistor $M_1$ with a biasing voltage. The drain of transistor $M_1$ is further connected to ground via a bypass capacitor $C_{bypass}$. The bypass capacitor $C_{bypass}$ provides a close circuit path during high frequency operation of the VCO 300. The source of transistor $M_1$ is connected to ground through a resistor $R_s$ for providing a reference point during the high frequency operation of the VCO 300.

A second inductor 304 is mutually coupled to the first inductor 302 during high frequency operation and jointly forms a balanced-to-unbalanced transformer (Balun) 306 for providing the differential output of the VCO 300 through output terminals Out_P and Out_M. The step-down feature of the Balun 306 also desensitised the VCO 300 from an external load (not shown). Due to a small structural size, the Balun 306 substantially avoids any undesirable parasitic associated therewith during high frequency operation of the VCO 300.

The second inductor 304 is tapped substantially in the centre and connected to a reference voltage, preferably the ground for providing a substantially balanced output to the external load connected to output terminals Out_P and Out_M. The coils of the second inductor 304 may be increased or decreased accordingly for matching an output impedance of an external load.

An impedance matching circuit 308 having at least two capacitors is coupled to the second inductor 304 for matching the output impedance of the external load and achieving maximum power transfer to the external load at a required operating frequency. The impedance matching circuit 308 comprises two capacitors $C_{tune1}$ and $C_{tune2}$ having terminals interconnected such that $C_{tune1}$ and $C_{tune2}$ are connected in series. The interconnected terminals of $C_{tune1}$ and $C_{tune2}$ are further connected to the reference voltage or ground.

Each of Capacitors $C_{tune1}$ and $C_{tune2}$ is replaceable by a varactor, wherein the capacitance of each varactor is tuneable by a potential difference.

The operating frequency of the VCO 300 is substantially dependent on an applicable potential difference across a varactor $D_v$. The cathode of the varactor $D_v$ is connected in series to a capacitive divider 310, wherein the capacitive divider 310 comprises two capacitors $C_1$ and $C_2$ having interconnected terminals that are further connected to the source of transistor $M_1$. The other terminals of $C_1$ and $C_2$ are respectively connected to the drain of transistor $M_1$ and the cathode of varactor $D_v$ for providing a feedback path for varying the operating frequency of the VCO 300. The cathode of the varactor $D_v$ is further connected to a voltage-control terminal $V_{control}$ via a biasing resistor $R_1$ in series therewith, while the anode of the varactor $D_v$ is connected to the reference voltage or ground. An applicable range of potential difference $V_{ctrl}$ is applied to the voltage-control terminal $V_{control}$ for changing the series capacitances of capacitors $C_1$ and $C_2$ and varactor $D_v$, thereby varying the operating frequency of the VCO 300.

Besides the operating frequency of the VCO 300 being substantially dependable on the applicable potential difference across the varactor $D_v$, there are other factors that may independently or in combination affect the operating frequency of the VCO 300. These factors include the inductance of the first inductor 302, the mutual inductance between the coils of first and second inductor 302, 304 and the associated parasitic capacitance of these components. The performance of operating parameters of the VCO 300 is optimised through simulation tests done on the VCO 300.

The VCO 300 according to the preferred embodiment is simulated using 0.18 μm standard CMOS technology parameters. The simulation results are shown in FIGS. 4 to 7. The VCO 300 is preferably simulated with Agilent's ADS2001 simulator. The simulated result of FIG. 4 shows a linearised phase noise plot at high operating frequency of 10 GHz where the phase noise is approximately 90 dBc/Hz at an offset of 100 kHz at the operating frequency. This indicates an improved phase noise performance over conventional VCOs.

Figure 5:
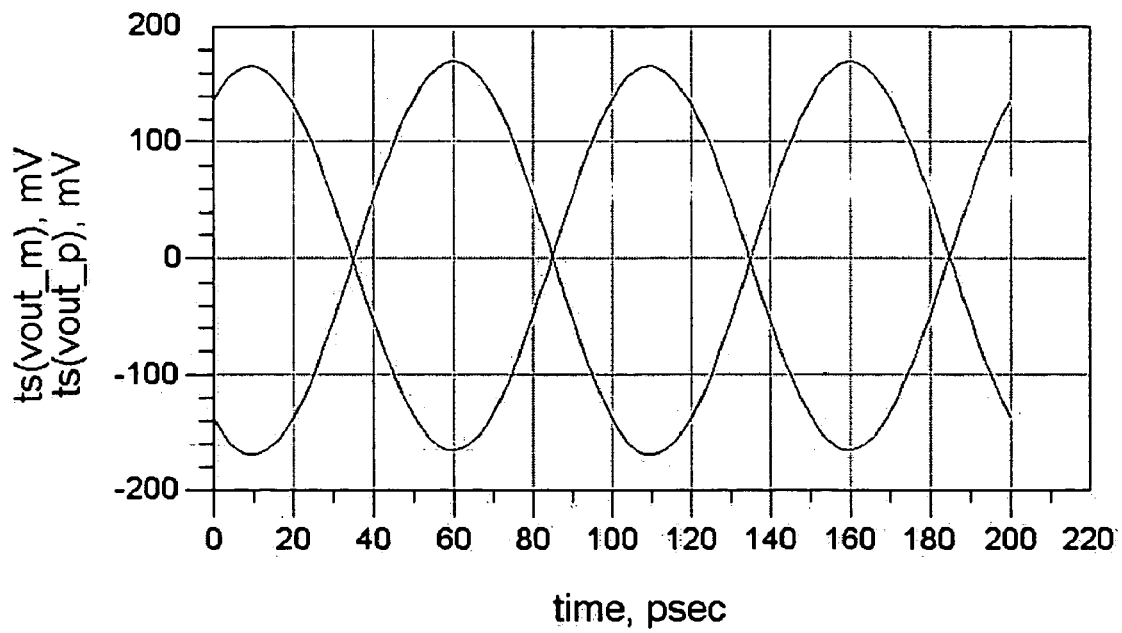
FIG. 5 is an output waveform plot of the voltage-controlled oscillator of FIG. 3.
Figure 6:
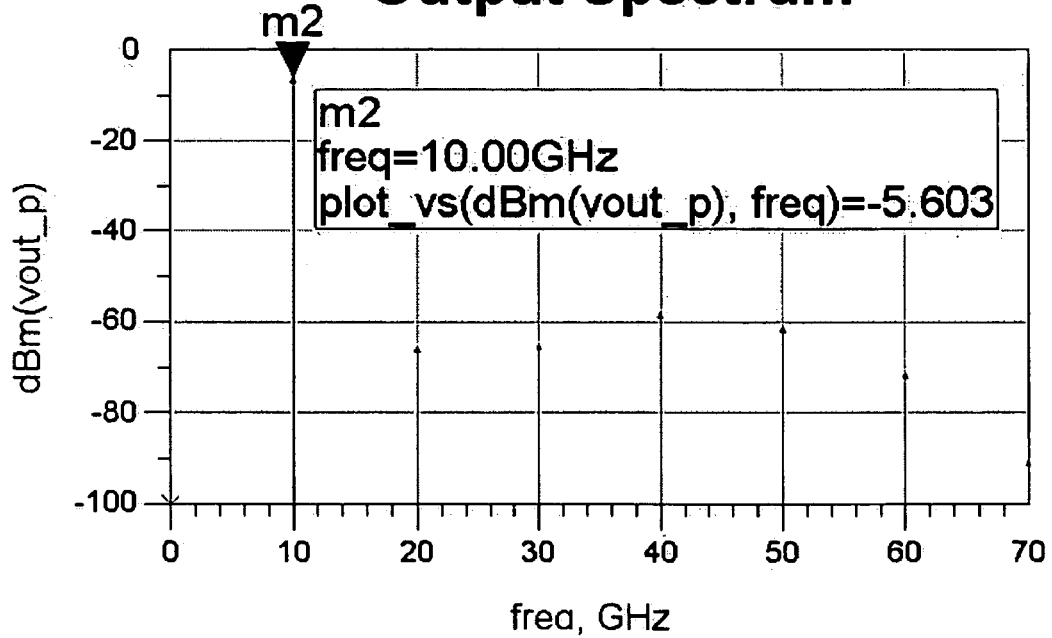
FIG. 6 is an output spectrum plot of the voltage-controlled oscillator of FIG. 3.
Figure 7:
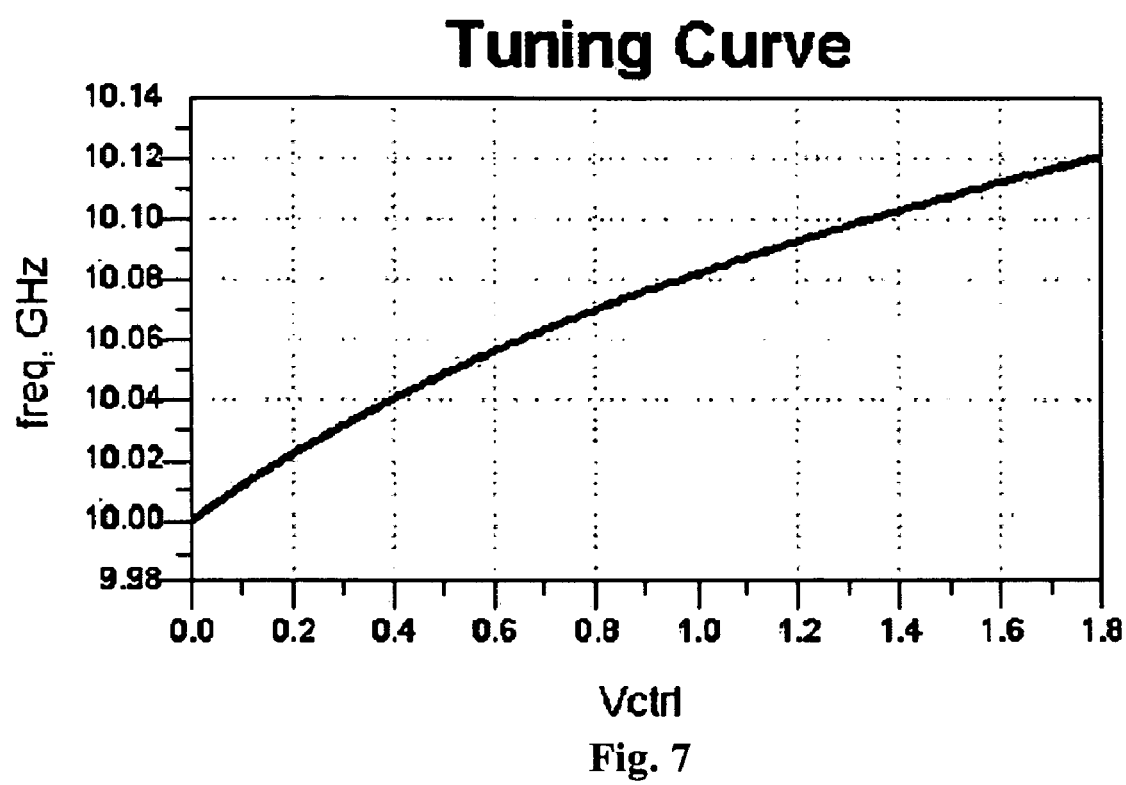
FIG. 7 is a tuning curve of the voltage-controlled oscillator of FIG. 3.

FIG. 5 shows a consistent generation of differential output waveforms from the VCO 300 at the operating frequency. As shown in FIG. 6, the output power is approximately—5.6 dBm for each single-ended output of the VCO 300, which is another improvement over conventional VCOs. FIG. 7 shows the linearised relationship between the operating frequency of the VCO 300 and the applicable range of potential difference $V_{ctrl}$ being applied to the voltage-control terminal $V_{control}$ of the VCO 300 for providing a substantially linearised frequency control thereof.

In the foregoing manner, a small sized, low current consuming voltage-controlled oscillator capable of performing high frequency operation and providing differential output is disclosed. Although only a number of embodiments of the invention are disclosed, it becomes apparent to one skilled in the art in view of this disclosure that numerous changes and/or modification can be made without departing from the scope and spirit of the invention. For example the Colplitts oscillator may be implement with a BJT or the like transistors to achieve the oscillating performance during high frequency operation. In addition, within the Balun configuration, the coils of the first and second inductor may have alternative turn ratios to satisfy the balanced output requirement.

The invention claimed is:

1. A voltage-controlled oscillator for generating differential output, the voltage-controlled oscillator comprising:
   a Colpitts oscillator having a first inductor and a capacitive divider having at least two capacitors connected in series;
   a varactor having a cathode directly connected in series with the capacitive divider of the Colpitts oscillator and an anode connected to a reference voltage; and
   a second inductor mutually coupled to the first inductor of the Colpitts oscillator for providing the differential output, the second inductor being substantially centrally tapped and directly connected to the reference voltage for providing a substantially balanced output, wherein the operating frequency of the voltage-controlled oscillator is dependent on an applicable potential difference between a control terminal connected to the varactor and the reference voltage.

2. The voltage-controlled oscillator of claim 1, wherein the voltage control terminal is provided for connection to the varactor via a biasing resistor for applying the applicable potential difference between the control terminal connected to the varactor and the reference voltage.

3. The voltage-controlled oscillator of claim 1, wherein the second inductor has a pair of output terminals for providing the differential output.

4. The voltage-controlled oscillator of claim 1, wherein the first inductor and the second inductor form a Balun.

5. The voltage-controlled oscillator of claim 1, wherein an impedance matching circuit having at least two capacitive tuneable elements connected in series is connectable to the second inductor for matching output impedance.

6. The voltage-controlled oscillator of claim 1, wherein the Colpitts oscillator is implemented with a bipolar transistor.

7. The voltage-controlled oscillator of claim 1, wherein the operating frequency of the voltage-controlled oscillator is dependable on the inductance of the first inductor.

8. The voltage-controlled oscillator of claim 1, wherein the operating frequency of the voltage-controlled oscillator is dependable on the mutual inductance between the first and second inductor.

9. The voltage-controlled oscillator of claim 1, wherein the operating frequency of the voltage-controlled oscillator is dependent on series combination of capacitances of the capacitive divider and the varactor.

10. The voltage-controlled oscillator of claim 1, wherein the number of coils of the second inductor is increased accordingly for supporting a larger external load.

11. The voltage-controlled oscillator of claim 1, wherein the reference voltage is a ground.

12. The voltage-controlled oscillator of claim 4, wherein the small structural size of the balun substantially reduces parasitic inductance and capacitance when the voltage-controlled oscillator is operating at high frequency.

13. The voltage-controlled oscillator of claim 5, wherein a balanced output impedance is achievable by providing predetermined capacitances of the at least two capacitive tuneable elements and a predetermined inductance of the second inductor.

* * * * *